United States Patent
Vergöhl et al.

(10) Patent No.: US 12,258,661 B2
(45) Date of Patent: Mar. 25, 2025

(54) DEVICE AND METHOD FOR PRODUCING LAYERS WITH IMPROVED UNIFORMITY IN COATING SYSTEMS WITH HORIZONTALLY ROTATING SUBSTRATE AND ADDITIONAL PLASMA SOURCES

(71) Applicant: FRAUNHOFER-GESELLSCHAFT ZUR FÖRDERUNG DER ANGEWANDTEN FORSCHUNG E.V., Munich (DE)

(72) Inventors: Michael Vergöhl, Braunschweig (DE); Andreas Pflug, Braunschweig (DE); Tobias Zickenrott, Braunschweig (DE); Stefan Bruns, Braunschweig (DE)

(73) Assignee: Fraunhofer-Gesellschaft zur förderung der angewandten Forschung e.V., Munich (DE)

( * ) Notice: Subject to any disclaimer, the term of this patent is extended or adjusted under 35 U.S.C. 154(b) by 0 days.

(21) Appl. No.: 17/760,310

(22) PCT Filed: Feb. 12, 2021

(86) PCT No.: PCT/EP2021/053428
§ 371 (c)(1),
(2) Date: Aug. 8, 2022

(87) PCT Pub. No.: WO2021/160786
PCT Pub. Date: Aug. 19, 2021

(65) Prior Publication Data
US 2023/0067917 A1    Mar. 2, 2023

(30) Foreign Application Priority Data
Feb. 13, 2020  (DE) .................. 10 2020 201 829.4

(51) Int. Cl.
*C23C 14/54* (2006.01)
*C23C 14/00* (2006.01)
(Continued)

(52) U.S. Cl.
CPC ........ *C23C 14/351* (2013.01); *C23C 14/0036* (2013.01); *C23C 14/357* (2013.01);
(Continued)

(58) Field of Classification Search
None
See application file for complete search history.

(56) References Cited

U.S. PATENT DOCUMENTS 4,721,553 A * 1/1988 Saito ................. C23C 14/357
204/298.18
4,851,095 A    7/1989 Scobey et al.
(Continued)

FOREIGN PATENT DOCUMENTS

| CN | 1087130 A | 5/1994 |
| CN | 101798676 A | 8/2010 |

(Continued)

OTHER PUBLICATIONS

Mišina et al., "Plasma diagnostics of low pressure microwave-enhanced d.c. sputtering discharge," *Surface and Coatings Technology* 74-75(1): 450-454 (1995).
(Continued)

*Primary Examiner* — Jason Berman
(74) *Attorney, Agent, or Firm* — Leydig, Voit & Mayer, Ltd.

(57) ABSTRACT

The invention relates to a device and a method for producing layers whose layer thickness distribution can be adjusted in coating systems with horizontally rotating substrate. A very homogeneous or a specific non-homogeneous distribution can be adjusted. The particle loading is also significantly
(Continued)

reduced. The service life is significantly higher compared to other methods. Forming of parasitic coatings is reduced.

21 Claims, 6 Drawing Sheets

(51) Int. Cl.
- C23C 14/35 (2006.01)
- C23C 14/50 (2006.01)
- H01J 37/32 (2006.01)
- H01J 37/34 (2006.01)

(52) U.S. Cl.
CPC .......... *C23C 14/505* (2013.01); *C23C 14/547* (2013.01); *H01J 37/32201* (2013.01); *H01J 37/32366* (2013.01); *H01J 37/32715* (2013.01); *H01J 37/3405* (2013.01); *H01J 37/3476* (2013.01); *H01J 2237/20214* (2013.01); *H01J 2237/24585* (2013.01); *H01J 2237/332* (2013.01)

(56) References Cited

U.S. PATENT DOCUMENTS

| | | | |
|---|---|---|---|
| 5,397,448 A | 3/1995 | Gesche et al. | |
| 5,415,754 A | 5/1995 | Manley | |
| 5,609,772 A | 3/1997 | Daubenspeck et al. | |
| 5,851,365 A | 12/1998 | Scobey | |
| 6,051,114 A * | 4/2000 | Yao | H01J 37/32706 204/192.15 |
| 6,066,568 A * | 5/2000 | Kawai | H01J 37/32678 438/726 |
| 6,214,183 B1 * | 4/2001 | Maishev | H01J 37/3053 204/298.19 |
| 8,574,409 B2 | 11/2013 | Kadlec et al. | |
| 8,736,176 B2 | 5/2014 | Pelletier et al. | |
| 8,956,511 B2 | 2/2015 | Scherer et al. | |
| 9,349,576 B2 | 5/2016 | Bernick et al. | |
| 9,803,276 B2 | 10/2017 | Vergöhl et al. | |
| 2003/0042130 A1 | 3/2003 | Krassnitzer | |
| 2005/0061666 A1 | 3/2005 | Gupta et al. | |
| 2007/0227882 A1 | 10/2007 | Trassl et al. | |
| 2009/0283400 A1 * | 11/2009 | Stowell | H01J 37/3405 204/192.12 |
| 2011/0127157 A1 | 6/2011 | Bellido-Gonzalez | |
| 2011/0215722 A1 | 9/2011 | Pelletier et al. | |
| 2011/0253529 A1 | 10/2011 | Ockenfuss | |
| 2011/0265583 A1 * | 11/2011 | Scherer | C23C 14/566 73/864.91 |
| 2012/0302141 A1 * | 11/2012 | Goela | G02B 1/10 451/56 |
| 2013/0032475 A1 | 2/2013 | Huhn et al. | |
| 2014/0262752 A1 | 9/2014 | Vergöhl et al. | |
| 2016/0254127 A1 | 9/2016 | Vergöhl et al. | |
| 2017/0371224 A1 | 12/2017 | Seeboth et al. | |
| 2021/0164092 A1 | 6/2021 | Vergöhl et al. | |
| 2022/0213591 A1 | 7/2022 | Vergöhl et al. | |

FOREIGN PATENT DOCUMENTS

| | | |
|---|---|---|
| CN | 106480420 A | 3/2017 |
| DE | 10 2013 207771 A1 | 10/2014 |
| DE | 10 2013 221029 A1 | 4/2015 |
| JP | H06-17247 A | 1/1994 |
| JP | 2004-043934 A | 2/2004 |
| JP | 2015-193863 A | 11/2015 |
| WO | WO 2010/049456 A1 | 5/2010 |

OTHER PUBLICATIONS

China National Intellectual Property Administration, First Office Action in Chinese Patent Application No. 202180014314.5 (Oct. 30, 2023).
China National Intellectual Property Administration, Second Office Action in Chinese Patent Application No. 202180014314.5 (May 8, 2024).
Arnell et al., "Recent advances in magnetron sputtering," *Surface and Coating Technology* 112(1-3): 170-176 (1999) Abstract only.
Siemers et al., "Particle-in-cell Monte Carlo Analysis of Anomalous Target Erosion in Magnetron Sputtering," 51st *Annual Technical Conference Proceedings*, Chicago, IL, Apr. 19-24, 2008, pp. 43-48.
European Patent Office, International Search Report in International Application No. PCT/EP2021/053428 (May 25, 2021).
European Patent Office, Written Opinion in International Application No. PCT/EP2021/053428 (May 25, 2021).
International Bureau of WIPO, International Preliminary Report on Patentability in International Application No. PCT/EP2021/053428 (Aug. 11, 2022).
China National Intellectual Property Administration, Decision on Rejection in Chinese Patent Application No. 202180014314.5 (Aug. 14, 2024).

* cited by examiner

DEVICE AND METHOD FOR PRODUCING LAYERS WITH IMPROVED UNIFORMITY IN COATING SYSTEMS WITH HORIZONTALLY ROTATING SUBSTRATE AND ADDITIONAL PLASMA SOURCES

CROSS-REFERENCE TO RELATED APPLICATIONS

This Patent application is the U.S. national phase of International Application No. PCT/EP2021/053428, filed on Feb. 12, 2021, which claims the benefit of German Patent Application No. 10 2020 201 829.4, filed Feb. 13, 2020, the disclosures of which are incorporated herein by reference in their entireties for all purposes.

The invention relates to a device and to a method for producing layers having adjustable uniformity on coating systems with a horizontally rotating substrate guidance. Alternatively, specific layer thickness gradients can be set. The particle load is additionally considerably reduced. The service life is considerably increased with respect to other methods. Parasitic coatings are reduced. The coating rate is also increased.

Optical layers today frequently comprise a sequence of low refraction and high refraction layers in which therefore specific materials are stacked above one another. The layer thicknesses can amount to between a few nm and several μm depending on the function and the wavelength range. Materials are, for example, $SiO_2$, $Ta_2O_5$, $Nb_2O_5$, $HfO_2$, $ZrO_2$, $TiO_2$. Amorphous Si materials containing hydrogen (a-Si:H) are also used.

A desired layer function is achieved by the suitable stacking of the layer sequence above one another. This can, for example, be a bandpass filter or an edge filter. Coatings to control the phase position of the reflected or transmitted light are also possible.

The spectral location of the edge or of the bandpass is decisive for the function of the coating. There is therefore great interest in achieving uniform layers on the coating material. In other applications, layers are also required in which a specific layer profile is desired. This is the case for bandpass filters in which the central wavelength depends on the position (gradient filters). Such gradient filters are used, for example, on photosensitive sensors in image processing. These often have a coating width of a few 10 mm and continuously image a central wavelength range from approx. 190 nm to 1100 nm. Only about ⅙ of the layer thickness is required as with 1100 nm with a central wavelength of 190 nm for a 30 mm long sensor. As the sensor surface becomes smaller, the layer thickness gradient would further increase so that steeper gradients have to be implemented.

A specific layer thickness distribution is also often required on 3D components such as lenses. This can require a lateral gradient having a specific shape.

As a rule, a plurality of layers are stacked above one another. Filter coatings are then produced having a layer number of less than 4 and more than 100, frequently having thicknesses of less than 1 μm and more than 10 μm or even several 10 μm.

A further demand is also to introduce as few defects as possible into the layer. This can be caused, for example, by flaking off of parasitic coatings on chamber walls or system components that are located in the region of the coating. Particles can also accumulate in the plasma for a longer period of time and possibly continue to grow there due to the coating current.

These "parasitic" coatings are formed since the coating source has a relatively wide distribution of the dusted coating material into the room. A large portion of the coating therefore moves onto the chamber walls or onto components that are arranged directly in front of the substrates for a rate correction instead of onto the substrates. If the coating is too thick in these regions or if thermal loads arise, particles can be released from these coatings or also the total parasitic coating can be released. Particles can, however, also be produced directly on the sputtering sources.

Many attempts have been made to reduce the particle load. It was simultaneously attempted to develop production processes that can produce very uniform layers. Alternatively, layers can also be manufactured with a defined gradient in the layer thickness.

The manufacture of low particle optical layers can take place using a magnetron sputtering device such as is known from U.S. Pat. No. 9,803,276 B2. The manufacture of low particle coatings is presented in this document, with the cleanliness of the coating being achieved by the use of cylindrical source material (rotatable magnetrons), optionally together with a reactive gas component, applied to the substrate by magnetron sputtering. The application of the layer takes place against gravity in a so-called "sputter-up" process. Since a substrate subrotation (satellite movement) is not provided, a layer thickness profile is produced on the substrate that increases inversely proportionally to the radius to the center of rotation. In an arrangement, for example, in which the substrate center has moved 600 nm from the center of rotation and the substrate has a diameter of 200 mm, only approximately 70% of the layer rate would arrive at the outside with respect to the rate at the inside. The setting of the layer uniformity therefore takes place using masks that locally restrict the coating flow. The mask is disposed between the source and the substrate; as a rule here closely to the substrate to be able to set the layer distribution as exactly as possible. The mask is thus disposed directly in the coating region. Since unlike moved substrates the mask is usually attached statically, it receives a large amount of material. In the above-described geometry with a substrate center of 600 mm distant from the center, a correction aperture has a rate approximately 5-10 times as large as the substrates themselves. If therefore 10 μm of layer material is deposited on the substrate, the screen already receives 100 μm. The material supply is very large in particular with cylindrical sputtering sources so that in principle a service life of a plurality of months would be possible. If these targets, for example, have a service life of 8000 hours, a service life of 67 days would be possible at the power of 5 kW. With a coating rate of 0.3 nm/s, a layer thickness of 480 μm could thus be deposited on the substrate without having to replace the target. If the second material is included, the layer thickness would accumulate to over 5 mm on the uniformity screens. It is, however, favorable not to exceed a specific thickness of approximately 1 mm on the uniformity screens.

If the thickness on the screen is too large, flaking and particle formation can occur so that systems have to be cleaned beforehand as a rule, with the screens also being cleaned or even replaced. The service life of the system is thus also limited after a cleaning. This is in particular of particular disadvantage in current systems that work with cylindrical sputtering sources because the sputtering sources themselves have a multiple service life in comparison with conventional linear magnetrons. The production time could be considerably extended without an intermediate cleaning if it proves possible to reduce the parasitic coating on the uniformity screens.

Another method of depositing high quality optical coatings is described in U.S. Pat. No. 8,956,511 B2. A turntable arrangement is provided there in which the substrates rotate on a plate and a very thin partial layer of a few 0.1 nm is deposited on every passage. Oxygen is added at the location of the magnetron so that a hypostoichiometric layer is first deposited. This layer is oxidized using a subsequent plasma source. The setting of the layer thickness distribution takes place by means of so-called "correction masks" that take away a larger coating portion in the inner region than in the outer region. If the magnetrons are not substantially longer in comparison with the substrate diameter, the screens are even of bone shape because the layer profile of the magnetron is highly variable toward the ends.

A likewise frequently used method is the user of a satellite rotation of the substrates. The substrates are located on a rotating plate and rotate about themselves in so doing. Annular sputtering sources are used here.

A method is known from U.S. Pat. No. 8,574,409 in which a set of magnets rotates with an annular magnetron and the power is periodically modulated here at a specific frequency to improve the uniformity of the layer distribution.

An annularly closed target is described in U.S. Pat. No. 5,609,772 A, in which the magnetic field lines on the target can be displaced with a magnetic field additionally produced by an exciting current. The profile of the target erosion can thus be displaced and the distribution of the rate can be influenced, for example.

A sputtering arrangement without masks is described in US 2011/253529. A high uniformity is achieved there in that a specific dimensioning of an annular magnetron source having a specific diameter is proposed. The center of the magnetron cathode is central to the rotating substrate centers. A planetary drive is, however, provided there so that two rotations are superposed.

Different kinds of magnetron sources are used in sputtering systems. A so-called drum geometry is described in U.S. Pat. No. 4,851,095. Here, the sources are typically located as a linear source at the side walls of a chamber. The substrates are located inwardly on a rotating drum. In a variant, layer distributions on the substrate can be influenced by varying the distance of individual magnets from the target surface along the target axis. Individual magnets are set back in this process. This method is called "UniTune" and makes possible a distribution to +/−1% without shapers. The setting is thus possible within very tight limits (a few %).

This method would not be suitable for the proposed arrangement with a turntable since it would have the consequence of a very high attenuation of the magnetic field so that the impedance and thus the voltage of the process would increase greatly. In addition, a very much higher change of the rate by approximately 30% is needed for the present method.

A similar method is proposed in US 2003/0042130. "Electron traps" are introduced there with the aid of an additional magnetic field at the target by which the plasma density and thus the sputtering yield along the target can be influenced.

The variation of the geometry of magnets to control the layer distribution is also described for cylindrical magnetron sources in US 2013/0032475. Either the distance between the target and the substrate can be varied or also the rotational angle of the whole set of magnets ("swing cathodes").

A specific magnet system for cylindrical magnetrons is described in U.S. Pat. No. 9,349,576. The magnets have a specific shape there and the magnetron can be used as a retrofit for planar magnetrons.

In R. D. Arnell et al., "Recent advances in magnetron sputtering", Surf. Coat. Technol. 112 (1999), p. 170, the method of "closed field unbalanced magnetron sputtering" is described. It reports on the magnetron configuration of dual magnetron arrangements.

Magnetron arrangements can be both unbalanced and balanced. Unbalanced arrangements are spoken of when e.g. the outer magnet ring has a higher field strength than the inner ring. Some electrons are thereby no longer held at the target, but rather follow the magnetic field lines in the direction toward the substrate. The plasma expands further towards the substrate, and the layer can be compressed better, for example. It can, however, also be disadvantageous that more particles are carried into the layer. With a balanced arrangement, in contrast, the plasma is held more at the target. Arnell et al. also propose a closed field arrangement with dual magnetrons in which magnetrons disposed next to one another have opposite polarity (dual co-planar closed field arrangement). A better plasma density and the possibility of manufacturing better materials are considered advantages of this arrangement. Working in a closed field arrangement is proposed there. A plurality of magnetron sources are required on the chamber for this purpose. The polarity of the magnets does not take place in the same manner for all the sources here, but rather in each case opposite to the adjacent cathode. While one cathode therefore has a polarity N—S—N, the cathode disposed next to it has a polarity S—N—S. This has the result that the plasma is guided more from one cathode to the next and is closed more (closed field). However, the lateral distribution of the layer along the target axis is not considered there. The closed field arrangement should serve to produce denser layers having better properties.

The magnetrons can be linear sources, round sources, or also cylindrical sources. They can be operated by means of DC current or AC current in the mid frequency range (10-20 kHz). Radio frequencies (RF, typically 13.56 MHz are also used with insulating sputtering materials. The sources can be unipolar (sputtering source as the cathode, the respective positive pole designed as a separate anode) or as bipolar.

An approach is described in US 2016/0254127 A1 in which the layer thickness distribution is influenced by two magnetrons. The approach is based on a rotation of the magnets that effect a (de)coupling of the magnetic fields. A tilting of the distribution can thus be made possible for the case of a turntable arrangement. However, this approach is only suitable for small changes in the distribution and furthermore requires the use of masks.

U.S. Pat. No. 8,574,409 describes a system in which a power modulation is used in an annular magnetron in dependence on the rotation of a set of magnets. Magnets are known from US 2005/0061666 A1 that are moved by planar magnets in operation ("sweeping") so that a higher target utilization results. Frequently, so-called shunts are used to influence the magnetic field in magnetrons (U.S. Pat. No. 5,415,754). The shunts are ferromagnetic plates that are placed below the targets between the magnet rows. The field lines thus run flatter at the target between the racetracks. It is in contrast disadvantageous that with bipolar processes a magnetic barrier is set up for the electrons between the targets. As a rule the impedance and thus also the discharge voltage of the generator thus increase. This is unfavorable because a high voltage can result in increased particle formation. 3D effects often occur with magnetron discharges. For example, the "cross-corner" effect is known (Siemers, M. et al., Proc. 51$^{st}$ SVC Tech. Conf., 2008, 43-48) with diagonally symmetrical inhomogeneities. There is likewise such an effect with cylindrical magnetrons. An asymmetrical magnet system is described in US 2011/0127157 that can be used for cylindrical single or dual magnetrons. The plasma is pulled more between the cathodes due to the asymmetrical design, with the electrons being able to move better to the respective anodes and producing a smaller impedance.

The use of plasma sources in the sputtering region is also known. It is often desirable to increase the distance between the source and the substrate in order to achieve a low defect density in the layer. Such a device is described in U.S. Pat. No. 5,851,365. There must be enough energetic particles in the plasma in order for the layers to achieve good quality and high density and low roughness. This is achieved by a sufficiently high free path length of the sputtered particles. If the distance is increased (in U.S. Pat. No. 5,851,365 to >30 cm, corresponding to a factor of approx. 3-5), the sputtering process must accordingly be operated at a lower pressure. This is achieved in U.S. Pat. No. 5,851,365 by very strong pumps below the magnetron sources. An ion gun aimed at the substrate can additionally densify the layer. In this arrangement, a shielding and a gas inlet were provided around the target. The purpose of this is to locally increase the pressure on the magnetron so that the target can run stably. Without the shielding, the pressure at the magnetron would be too low to ignite the plasma.

M. Misina, J. Musil, Surf. Coat. Technol. 74 (1995, p. 459) describes an ECR microwave (electron cyclotron resonance) being able to be used in a magnetron compartment to operate a discharge at low pressure.

Starting from this, it was the object of the present invention to provide a device that ensures a high and more stable uniformity of the layers and in so doing parasitic deposits are simultaneously avoided to increase the production time of the device. It is, however, also equally the object of the present invention for layers to be set more exactly with a targeted inhomogeneity and also with steeper layer thickness gradients.

This object is achieved by the features of the device and by the method described herein and by the advantageous developments thereof.

In accordance with the invention, a device is provided for depositing uniform layers on rotationally moved substrates by means of magnetron sputtering that includes the following components:
a) a vacuum chamber with a sputtering compartment,
b) at least one inlet for a sputter gas;
c) a turntable with at least one substrate holder; and
d) at least one magnetron sputtering source arranged in the sputtering compartment and with at least one electrode, with at least one further microwave plasma source being arranged in the sputtering compartment.

The core of the present invention is based on the fact that an inhomogeneous, that is, locally different, plasma density is generated, which makes it possible for the removal rate to be adjusted in a targeted inhomogeneous manner. The inhomogeneity can also be adjusted such that a specific distribution is produced on the substrate in the running direction. At the same time, the plasma density at the magnetron sputtering source is increased so that the sputtering process can also be operated at lower pressure.

The locally different plasma density is caused by the use of at least one microwave plasma source, which generates the plasma in a spatially limited region. This means that the plasma has an extent that is considerably smaller than the length or diameter of the magnetron cathode. Preferably, the at least one microwave plasma source is an ECR microwave plasma source or a plasma source having magnetic confinement capability. One or more microwave plasma sources are arranged in the sputtering region and their power can be set and regulated individually. The distribution of the coating rate is changed in the longitudinal direction, that is, along the target axis of the magnetron. Influencing the distribution in the running direction of the substrates is also conceivable. It is hereby made possible to produce layers of high and stable uniformity on the substrate during the coating process. The distribution can also be regulated by using the measurement of the layer thicknesses on the substrate.

The present invention relates to a new configuration of the microwave plasma sources for magnetron electrodes arranged linearly relative to one another, with which a coating with a very high and stable uniformity can be achieved in the case of substrates to be coated in a rotating manner (rotary plate arrangement). The asymmetry is achieved in that the microwave plasma source(s) can be individually adjusted in terms of their power and can also be arranged asymmetrically. At the same time, the sputtering pressure can also be reduced so that the distance between the substrate and the sources can be increased.

The device in accordance with the invention and the method in accordance with the invention show the advantage that the distribution of the layer thicknesses can be set very quickly and during the coating process. Finally, the discharge should also be able to be operated at low pressure below 3×10−3 mbar, so that coating at a greater distance is also possible with the same energy input into the substrate.

The type of microwave plasma sources that can be used in accordance with the invention are basically not limited. Semiconductor-based sources can be built very compactly, so that a relatively spatially limited plasma is generated. The one or more plasma sources can be arranged underneath the magnetrons or on the side of the chamber walls. The advantage of this arrangement is that the power of the sources can be changed quickly or switched off completely. This would not be possible with an arrangement based solely on controlling the magnetic field strength.

In contrast to the methods known from the prior art, the layer thickness distribution on the substrate can also be changed.

DE 10 2013 207 771 A1 proposes a linear tilting of the distribution, which makes it possible to change the layer thickness distribution. In contrast, the method proposed here is more flexible and also faster.

The proposed configuration is also advantageous because it makes is possible to again reduce the impedance of the discharge. This is favorable for materials that deliver a high impedance such as silicon or for materials with poor conductivity. However, a small discharge voltage is also favorable with other materials such as tantalum, niobium that either include metallic targets or targets that include metallic portions because this reduces the susceptibility to arc discharges. They generally result in particles.

This is also particularly advantageous in processes such as the metamode process where work is performed without a reactive gas in the region of the sputtering sources. Reactive gas frequently reduces the discharge voltage. This is also favorable for a process such as is proposed in DE 10 2013 221 029 A1 in which sputtering targets with ceramic portions are proposed; however, work is otherwise performed without oxygen in the sputtering region.

It is preferred that the inhomogeneous removal rate increases, preferably linearly, from the turntable center to the turntable margin and is particularly preferably proportional to the distance from the turntable center. A largely homogeneous coating hereby results on the substrate without the use of additional correction masks.

The device preferably has at least one additional plasma source via the microwave plasma source arranged in the magnetron compartment, the additional plasma source being located spatially separate at its own station. This additional plasma source is then preferably used for post-oxidation of the growing layer. A pretreatment of the substrate surface and/or modification of the structure and/or the stoichiometry is also possible. The additional plasma source should be spatially separated from the magnetron compartment to avoid interactions.

The turntable of the device in the process can rotate at a speed of 1-500 r.p.m., preferably 80-300 r.p.m. A fast rotation of the turntable in the range from 100-250 r.p.m. can be advantageous for a high throughput and a high precision.

The at least one magnetron sputtering source preferably consists of a dual magnetron source with electrodes made of a cylindrical or planar source material and a holder for this material and target belonging thereto. The at least two electrodes can here be electrically operated by means of bipolar pulsing. In this respect, sinusoidal pulses or also rectangular pulses are used, with the frequency also being able to be varied. The sputtering frequency can be varied here in a range from a few kHz up to a plurality of 100 kHz. Frequencies are preferably used between 10 kHz and 100 kHz, particularly preferably 20-60 kHz.

The magnetron sputtering sources can be used in a sputter down or also in a sputter up arrangement.

The at least one electrode preferably has one target that comprises or consists of at least one of the following components:
  a) ceramic material or material mixtures;
  b) thermally injected material or material mixtures;
  c) sintered material or material mixtures;
  d) crystalline material;
  e) metallic material or material mixtures; and/or
  f) a material containing an oxide; or
  g) mixtures thereof.

The electrode preferably consists of a target containing metal/semiconductor or consisting of ceramic material.

There are often compressive strains with high quality optical coatings. They are of high significance since they can result in deflections in the optics or also in a detachment of the layer or even in a break of the substrate. In accordance with the invention, the discharge voltage of the plasma can be reduced, which can result in a reduction of the layer voltage.

The at least one electrode can include a target. This can consist of a metal or of silicon or can also comprise or consist of a material containing oxide. Materials containing oxide have the advantage that they provide an oxygen source. Extra oxygen is sometimes required in the sputtering area; for example, because the oxygen of the plasma source is not sufficient for oxidation or because higher coating rates are to be achieved. It is favorable in this case to take the oxygen directly from the target, i.e. from the magnetron electrode, because a higher stability thus results in comparison with a target of metal and with oxygen as the reactive gas. For normally, the reactive coating of a metallic (or silicon) target using reacting gas results in a rate instability if the oxygen partial pressure is not kept precisely constant since the rate of a metallic target can be considerably different from the rate of the corresponding oxide. If the reactive gas (oxygen, nitrogen) is contained in the target, the rate is independent of the covering with an oxide layer.

Preferred materials containing oxide are $TiO_x$, $TaO_x$, $NbO_x$, $ZrO_x$, $ZrO_x$:Y, $CeO_x$, $ScO_x$, $HfO_x$, $AlO_x$, $SiO_x$, $ZnO_x$, $InSnO_x$ and/or $SnO_x$, where x is particularly preferably selected such that the target still just has conductivity, but x is simultaneously close to stoichiometry.

The invention can also be advantageous for the manufacture of layers on an Si base that in part contain hydrogen. Bandpass filters can thus be manufactured for the near infrared range. Very thin substrates that bend a lot are frequently used there. The layer voltage can also be reduced there in accordance with the invention.

The distance of the at least one substrate from the at least one magnetron electrode preferably amounts to 5 to 40 cm, preferably 5 to 30 cm, and very particularly preferably 10 to 20 cm. A small distance is favorable because it makes it possible to manufacture layers with high density. However, a very small distance is unfavorable because it can make the increased formation of particles possible. They can be electrically captured in the plasma and the substrate running through can thus act as a dust catcher.

Depending on the support of the microwave plasma source and the resulting adjustable process pressure, the distance can also be flexibly designed for the respective application. At a pressure of $3 \times 10^{-3}$ mbar, the distance should thus be about 6-10 cm, while at a pressure of $1 \times 10^{-3}$ mbar, the distance can also be about 18-30 cm in order to realize the same layer properties.

In accordance with the invention, there is also the possibility with the device of substantially increasing the distance between the electrodes and the magnetron without this causing any losses in the layer properties. Very dense and smooth as well as absorption-free layers are required in the desired applications for which purpose high particle energies are required as a rule. The process pressure furthermore has to be as small as possible so that no impacts of the sputtered particles on one another occur on the way from the target to the substrate. This can be achieved in that the process pressure in the sputtering chamber can be lowered to a value of less than $1 \times 10^{-3}$ mbar. This is possible in the method in accordance with the invention because the plasma density is considerably higher in the region of the electrodes. Magnetrons are typically operated at a pressure of some $10^{-3}$ mbar ($3 \times 10^{-3}$ mbar to $6 \times 10^{-3}$ mbar). A pressure variation has the effect of a surface roughness in a high quality optical coating. It can be measured using an AFM (atomic force microscope).

The roughness can also be set via the pressure with the microwave plasma source.

For example, a $SiO_2$ layer with a layer thickness of 2 μm has a roughness that is 0.9 nm higher than that of the substrate if it is produced at a pressure of $6 \times 10^{-6}$ mbar at the magnetrons. If the pressure is reduced to less than $3 \times 10^{-3}$ mbar, the additional roughness in comparison with the substrate falls to less than 0.1 nm when the distance between the source and the substrate is approximately 7 cm large. However, there is the problem in the methods in accordance with the prior art that the target voltage increases as the pressure falls and thus the tendency to arcing increases.

Similar phenomena can also be observed with a tantalum pentoxide layer. The additional roughness of a 2 μm thick $Ta_2O_5$ layer is here reduced to 0.1 nm compared to 0.2 nm or more if the pressure is reduced.

At a pressure of $1\times10^{-3}$ mbar, as is possible in accordance with the invention, the distance can be tripled without an additional roughness of the layer with respect to the layer occurring.

The distance can be considerably increased to 15 cm or 20 cm or more due to the lower process pressure of $1\times10^{-3}$ mbar. Alternatively, with a smaller distance and a pressure of $3\times10^{-3}$ mbar, the target voltage and thus the arcing tendency is reduced.

The advantage of the invention is that a high particle freedom can be implemented even with a relatively small distance, because the plasma can be pulled very close to the target. The distance can even be further increased by a pressure reduction without there being any compromises in the density of the layers.

A setting can be made via the power of the at least one microwave plasma source. Since the reduction in the sputtering rate reduces proportionally to the inverse value of the radius outwardly, the gradient on the substrate can be set via a suitable geometry with a given gradient of the sputter rate over the dual magnetron. If the radius for the substrate movement is increased, the relative reduction of the rate toward the outside is smaller and vice versa.

The advantage of this spacing is that a homogeneous coating of small components is made possible with a high density and a high precision. The precision of the coating process falls with higher spacings from the magnetron electrode to the substrate. The distance between the turntable and the walls of the magnetron sputtering device preferably amounts to 0.1 to 5 mm. This spacing has proved to be particularly favorable to design the magnetron sputtering device as gas-tight, i.e. to ensure an effective gas compartment separation within the apparatus.

The dual magnetron arrangement in accordance with the invention has the advantage that more source material can be deposited per time which the substrate dwells in the magnetron sputtering device in comparison with a single magnetron arrangement. The consequence is a substantially higher efficiency of the sputtering process. Furthermore, better long-term stabilities can be ensured by the use of dual magnetron arrangements with a bipolar excitation due to the "non-disappearing anode" and higher plasma densities in combination with denser (but also more stressed) layers.

In accordance with the invention, polymer substrates can be coated more favorably because the temperature of the discharge can be reduced due to the smaller discharge voltage and/or the greater distance.

The polymer coating can likewise be designed more favorably in accordance with the invention since the temperature introduction into the layer is also reduced as the discharge voltage falls.

The device can consequently advantageously have a device to produce mid-frequency discharges.

In a further preferred embodiment, the apparatus comprises two, optionally also three, magnetron sputtering devices. The advantage of such embodiments above all results with multilayer coatings, i.e. on the coating of a substrate with a plurality of different layers. In this case, stacks of two layer types which comprise different material (source material) can be generated with two magnetron sputtering devices. Consequently, the possibility is given in the case of three magnetron sputtering devices of sputtering stacks of three kinds of layers onto the substrate which layers comprise different material. Furthermore, material mixtures of the respective source materials can also be produced, i.e. mixed layers can be deposited. The use of two magnetron sputtering devices for optimizing the layer properties is in particular very advantageous in the area of very complex optical multilayer filters having more than 100 single layers. Depending on the demands (e.g. special design), three or more magnetron sputtering devices can also prove advantageous.

Ideally, the power of the generator for the microwave plasma source can be quickly modulated or switched. The layer thickness gradient can thus be changed quickly. It is further preferred that rectangular or sinusoidal pulses are used as the pulse shape for the generator, particularly preferably at a frequency of 40 kHz. The influence of the layer thickness distribution has the consequence that the correction aperture (shaper aperture) is no longer necessary. There is alternatively also the possibility that the correction aperture received substantially less coating material. In a standard embodiment, the layer thickness gradient is approximately 30% at a distance of the substrate center of 60 cm from the center of the turntable and with a substrate diameter of 200 mm. The screen therefore has to keep out 30% more layer at the inner margin of the substrate than at the outside. The layer thickness correction then runs over 30%. At the same time, the screen receives approximately eight times the rate that reaches the substrate. The advantage of the invention is that the screen only has to correct a few % because an already almost homogeneous coating is achieved on the substrate. The screen thereby receives a great deal less layer than in the standard configuration and can be used a lot longer. At the same time, the distribution can also be set very much more exactly since only a few % of the layer distribution has to be corrected. Since the screen also receives a great deal less layer, the drift of the distribution in the course of the coating is also smaller.

There is thus the option of also setting the distribution substantially more exactly. Whereas in a normal geometry without additional plasma sources the layer rate increases from the outside to the inside in accordance with the dependency $1/r$, the increase can be significantly reduced or adjusted as desired in accordance with the invention. This also makes it possible to considerably increase the service life of the system (cleaning), since the masks can be made smaller. The plasma impedance can also be reduced in the most favorable scenario to this extent. This is generally of advantage for the cleanliness of the coating because the tendency to arc discharges and thus the formation of particles is reduced.

The invention can also be used to generate a greater gradient. In this respect, the already present layer thickness gradient can again be increased by a screen without very sharp structures and edges being necessary at the mask.

Depending on the magnet design, the magnetron sources can project differently far into space. The substrate can thus be located either inside or outside the plasma, with the transition being fluid. It is favorable with respect to a small particle load that the substrate is outside the plasma since particles are often held in the proximity of electrical fields. The method in accordance with the invention makes it possible to decouple the plasma from the substrate. This has advantages for a good distribution of the layer thickness on the running substrate in the direction of running. If there are namely fluctuations of the plasma density on the substrate running through the plasma, deviations from the uniformity occur along the direction of running. This can arise if electrons see either a metallic surface (of the turntable) or an insulating surface (of the substrate). Electrons would be removed at the conductive surface so that less plasma can be produced there and the plasma density is reduced there. This also has an effect on the sputtering rate because fewer electrons are present in the plasma at specific points in time. A backsputter effect can also occur here. The effect is similar to that of the so-called "picture frame" effect (described in US 2007/0227882 A1). Pressure surges in the reactive gas at the start and end of the glass panes there result in rate changes in inline systems so that a different layer thickness is present at the ends of the glass panes. However, the two effects have different causes.

The magnetron sputtering device can have an effective gas compartment separation for gases within the vacuum of 1:25; 1:100 is better. An effective gas compartment separation between the coating stations of 1:100 makes possible the production of clearly defined co-sputtered materials. The reason for this is that noble gas and/or reactive gas of a magnetron sputtering device is prevented from moving into a further magnetron sputtering device of the same device. In addition, the quantity of noble gas and/or reactive gas can be set more precisely to a specific predefined value and/or be kept constant by the effective gas compartment separation.

Plasmas on a magnetron discharge basis as a rule comprise more than 99% non-ionized particles. They can have high energies and therefore make a high contribution to layer stresses. They can be indirectly influenced, for example, by changing the magnetic field design or by the use of alternative sputter gases. In accordance with the invention, the sputter gas can comprise or consist of a noble gas. Preferred noble gases are argon, neon, xenon and krypton. Noble gas mixtures are also possible. In accordance with the invention, the reactive gas can comprise or consist of an oxidizing gas. Oxygen, nitrogen, tetrafluoromethane, octafluorocyclobutane, carbon dioxide and hydrogen fluoride are preferred reactive gases. Mixtures of these gases can also be used.

Hydrogen can also be used.

One of the variants of the device preferably comprises a photometer. It is thereby made possible to photometrically monitor the thickness of the layer on the substrate during the sputtering process. For this purpose, a fast broadband measurement (e.g. of 200-2000 nm) of the transmission or reflection can be carried out. The measurements can be carried out under perpendicular incidence or also with oblique incidence. The layer thickness can be determined and monitored by a comparison with the spectrum theoretically to be expected. In some cases, a quartz crystal can additionally also be used, for example with cavity filters in which only a small signal change of the transmission is expected with certain layers.

With the aid of a plurality of measuring heads, the layer thickness can be measured at a plurality of points transverse to the running direction. An array spectrometer is also conceivable therefor, with which both a spectral and a spatial measurement of the transmission can be carried out transversely to the running direction. In this way, the layer thickness can be determined transversely to the running direction and the distribution can be regulated.

The distribution of the layer thickness on the substrate can also be determined using a single photometer by means of rotating the substrate through 90° by measuring in the running direction. This is then implemented by rotating the turntable and measuring at a plurality of points. Using this method, the layer thickness on the substrate can be completely mapped using a single spectrometer, and the layer thickness can also be regulated. If very fast regulation is required, this can also be realized using a mapping spectrometer in a "push-broom" approach. A 2D sensor is used here, which measures transversely to the substrate in one sensor axis and performs spectral decomposition in the second sensor axis. The entire surface of the substrate can be measured by continuously rotating the axis of rotation of the system.

In a further preferred embodiment of the device, the substrate holder comprises or consists of polyetheretherketone. The use of polyetheretherketone has the advantage that the particle formation is reduced.

It is further preferred that the device has a regulation system for regulating and/or stabilizing the reactive gas in the magnetron sputtering device. The reactive gas pressure is used as the control variable; either the power of the magnetron sources or, alternatively, the power of the microwave plasma sources can be used as the manipulated variable.

The advantage of this regulation is that no dielectric layer is removed from the target in the method in accordance with the invention, but the target is rather not covered by a dielectric layer at any time. This can be realized, for example, in that metallic targets are operated in the so-called "transition mode". The cylindrical source material (target) is here permanently in a metallic, oxide-free state due to a suitable regulation of the generator, while sufficient oxygen for the oxidation of the growing layer is present in the process space. The above-named control variables are as a rule realized on the oxygen partial pressure or the voltage of the generator or of the target. The deposition of stoichiometric layers can thus be achieved at a high deposition rate in the process, while the interfering influence of particles is minimized, i.e. a very low number of particles is achieved.

In accordance with the invention, a method of depositing uniform layers on rotationally moved substrates by means of magnetron sputtering is also provided in which
  a) at least one substrate is arranged on a turntable in a vacuum chamber with a sputtering compartment to enable a coating on a rotational movement of the substrate,
  b) at least one layer is deposited on the at least one substrate using at least one magnetron sputtering source arranged in the sputtering compartment and having at least one electrode, with the layers of source material of the electrodes being formed by sputter gas.

It is preferred that in the method in accordance with the invention, a homogeneous or inhomogeneous plasma density is generated in the sputtering compartment by means of the at least one microwave plasma source, which causes a homogeneous or inhomogeneous removal rate of the source material on the substrate.

In accordance with the invention, the microwave heads are placed asymmetrically in the sputtering compartment. This can be at the end of one magnetron, for example. If the plasma is ignited, the plasma increases locally and the rate increases at the relevant end of the magnetron. The plasma always has a certain range due to the movement of the electrons on the racetrack. Overall, the layer thickness can thus be increased at one end of the magnetron. The overall distribution can be changed by placing a plurality of microwave plasma sources.

A temporal modulation of the change in the plasma is also possible. This requires a suitable generator for the microwave plasma source, which is very fast. This is particularly advantageously possible through modern, semiconductor-operated microwave sources, as are described in WO2010/049456.

In another arrangement, a plurality of microwave plasma sources is deployed along a line of the longitudinal axis of the magnetron sources. A distance of approx. 10-15 cm is favorable here, so that with a cathode length of 60 cm, about 4 sources are installed. The microwave plasma sources can also deviate to the right or left of the line in order to further influence the distribution. In order to avoid coating of the plasma heads, these are preferably arranged outside the coating region. This can be between and below the magnetron sources. An arrangement laterally along one or the two longitudinal axes of the magnetron is also conceivable. A combination is also possible.

A noble gas, in particular argon, is preferably used as the sputter gas.

In addition to the sputter gas, at least one reactive gas can preferably be used, in particular selected from the group comprising oxygen, nitrogen, hydrogen carbon dioxide, hydrogen fluoride, tetrafluoromethane, octafluorocyclobutane, and mixtures thereof.

A preferred variant provides that the thickness of the layer on the substrate is monitored by at least one of the measures a) to e) for a process control:
 a) optical transmission monitoring;
 b) optical reflection monitoring;
 c) optical absorption monitoring;
 d) monowavelength ellipsometry or spectral ellipsometry; and/or
 e) crystal quartz measurement.

Microwave plasmas are shielded by metallic layers. Coating the microwave plasma source, especially with conductive material, should therefore be avoided. The microwave source can therefore advantageously be equipped with a protective coating. In this case, an enclosure is provided which is flooded with neutral gas so that the outflowing gas prevents particles from reaching the microwave plasma source. The sputtering compartment can then be supplied with gas from this gas source alone.

The device in accordance with the invention is preferably used for the performance of the method.

BRIEF DESCRIPTION OF THE DRAWINGS

The subject according to the invention is to be explained in more detail with reference to the following figures, without restricting it to the specific embodiments shown here.

DETAILED DESCRIPTION OF THE INVENTION

Figure 1:
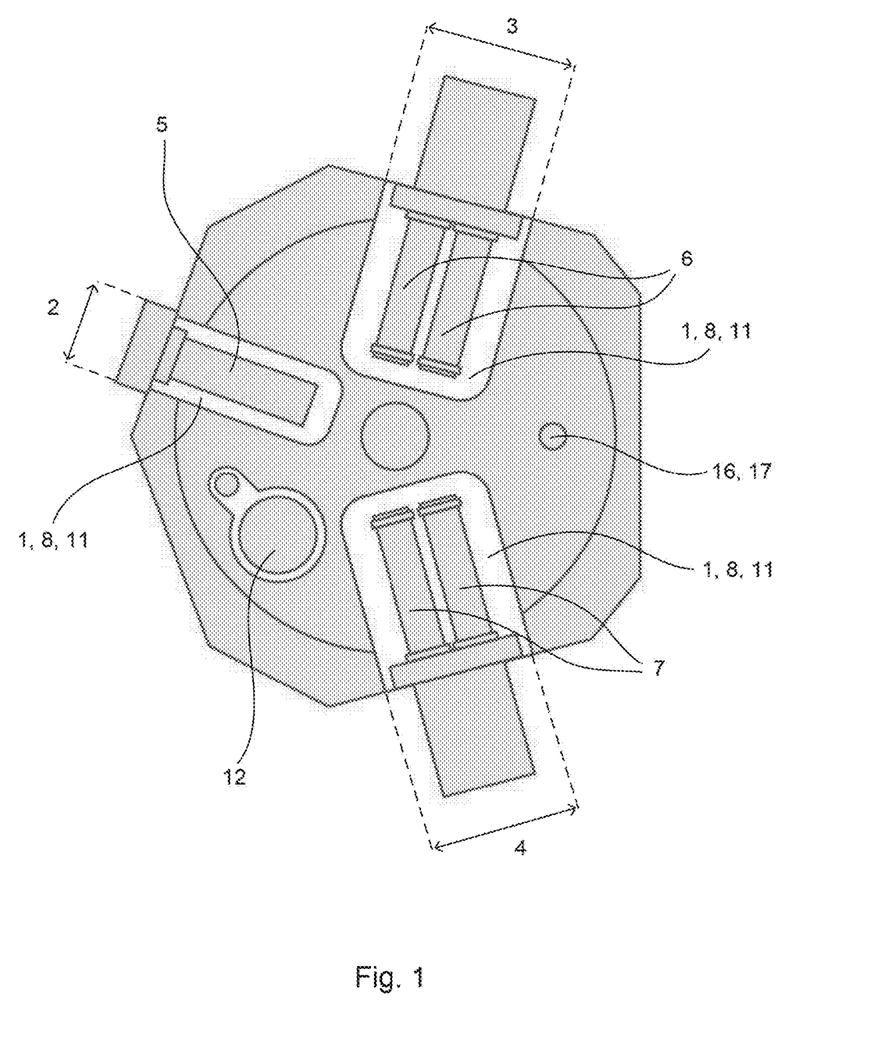
FIG. 1 shows a device in accordance with the invention without a turntable in a plan view.

FIG. 1 schematically shows a preferred device in accordance with the invention without a turntable in a plan view. The device has three magnetron sputtering devices 2, 3, 4, of which one is designed in the single magnetron arrangement 2 and two in the dual magnetron arrangement 3, 4. The magnetron sputtering device 2 comprises a magnetron electrode 5, sputter gas 11 and optionally reactive gas 8 and is in a vacuum 1. The magnetron sputtering devices 3, 4 each comprise two magnetron electrodes 6, 7, sputter gas 11, and optionally reactive gas 8 and are in a vacuum 1. A microwave plasma source 12 and a photometer 16 and/or an ellipsometry flange 17 are located in the vicinity of the magnetron sputtering devices 2, 3, 4.

Figure 2:
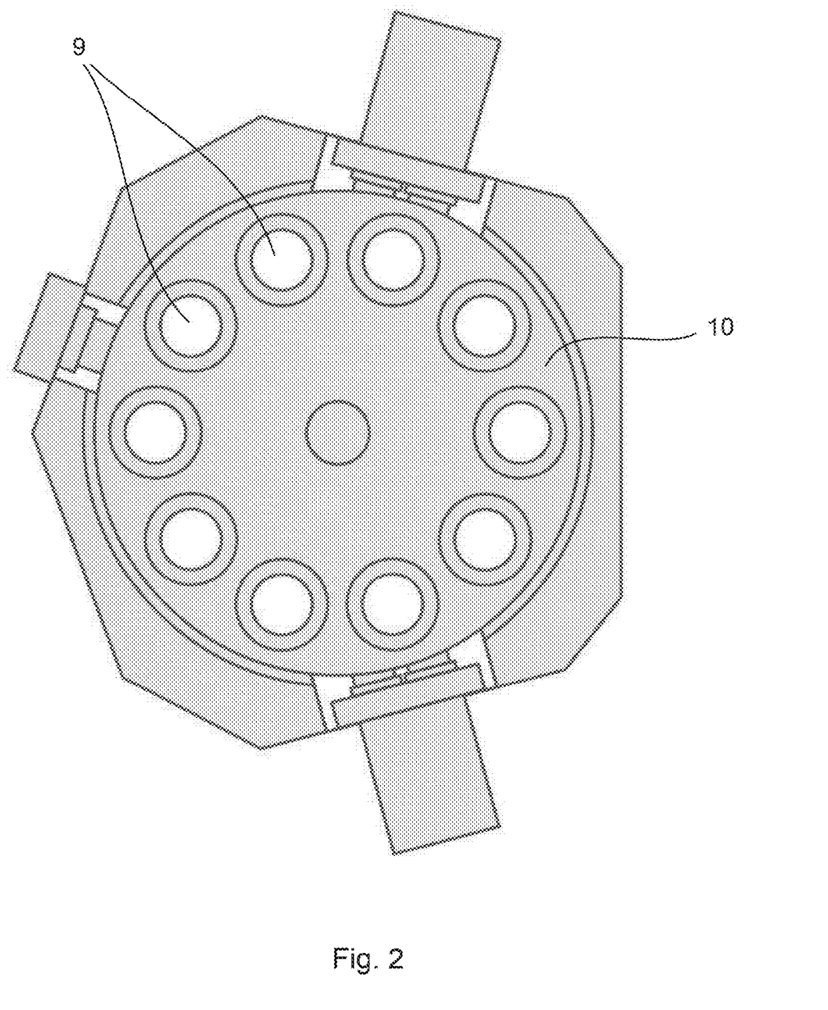
FIG. 2 shows a device in accordance with the invention with a turntable in a plan view.

FIG. 2 schematically shows a preferred embodiment of the turntable in a plan view. The turntable 10 is located in the apparatus and in this example has ten identical substrate holders 9.

Figure 3:
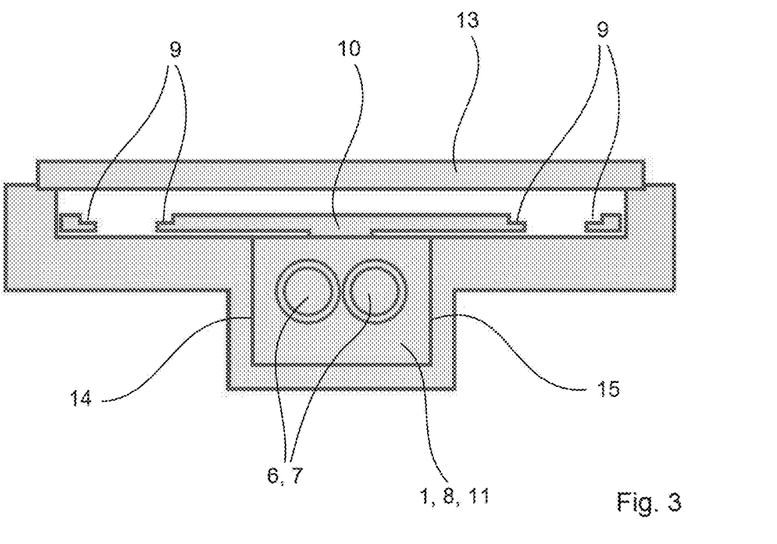
FIG. 3 shows a device in accordance with the invention in a sectional representation.

FIG. 3 schematically shows a preferred embodiment of the device with a turntable 10 in a side view. The cross-section of a magnetron sputtering device is visible which comprises two cylinders of source material 6, 7 (dual magnetron arrangement). The magnetron sputtering device is delineated in a gas-tight manner from the rest of the device at the sides of boundary walls 14, 15 and at the top by the turntable 10; it comprises sputter gas 11, optionally reactive gas 8 and is in a vacuum 1. Two substrate holders 9 of the turntable 10 are shown or visible in the cross-section. A cover 13 is located above the turntable 10 and has boundary walls which are located to the side of the turntable 10 that closes the device in a gas-tight manner.

Figure 4:
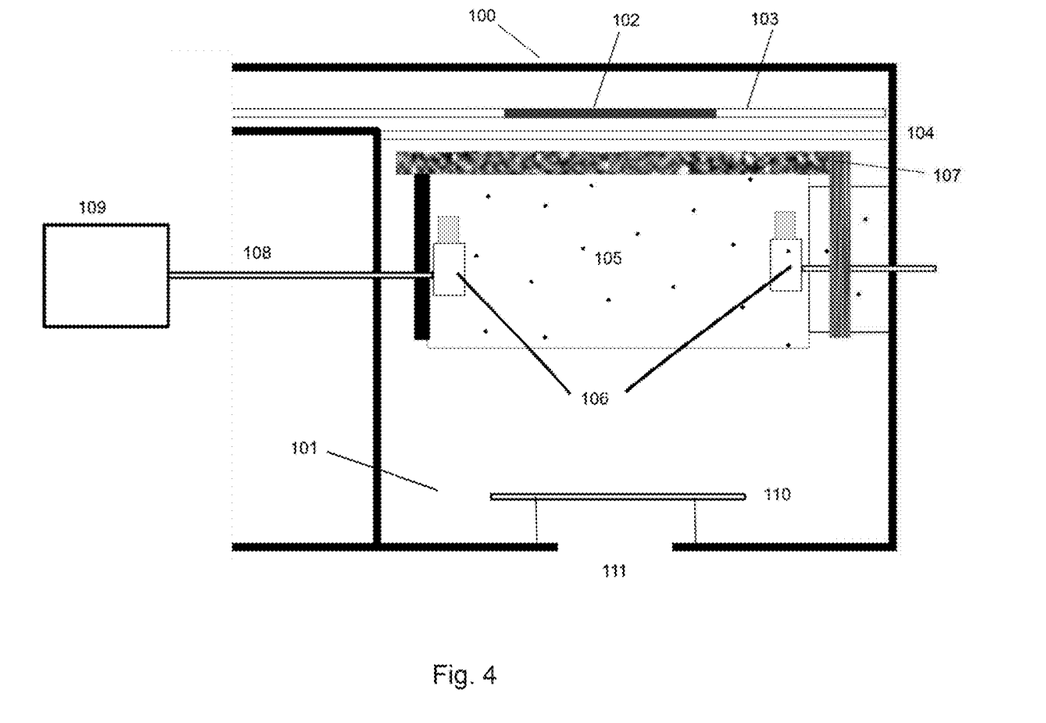
FIG. 4 shows a device in accordance with the invention in a sectional representation.

FIG. 4 schematically shows the device in accordance with the invention. 100 shows the vacuum chamber in which a sputtering compartment 101 is installed. The substrate 102 is located on the turntable 103, which continuously rotates around the center during the coating process. In this example, the coating is operated against gravity from bottom to top. The magnetron electrodes 6 are accordingly located below the substrate. The distribution of the coating can be adjusted by a coating mask 104 such that a homogeneous layer is deposited on the substrate. The arrangement comprises two microwave plasma sources 106 arranged between the two magnetron sources at the ends of the cathodes, respectively. The magnetron sources also comprise a shutter 107 which can be rotated between the substrate and magnetron source so that the coating can be stopped. A current feedthrough 108 and a generator 109 are connected to the microwave plasma source. 111 is the pump flange and 110 is a shield against falling particles to protect the pump.

Figure 5:
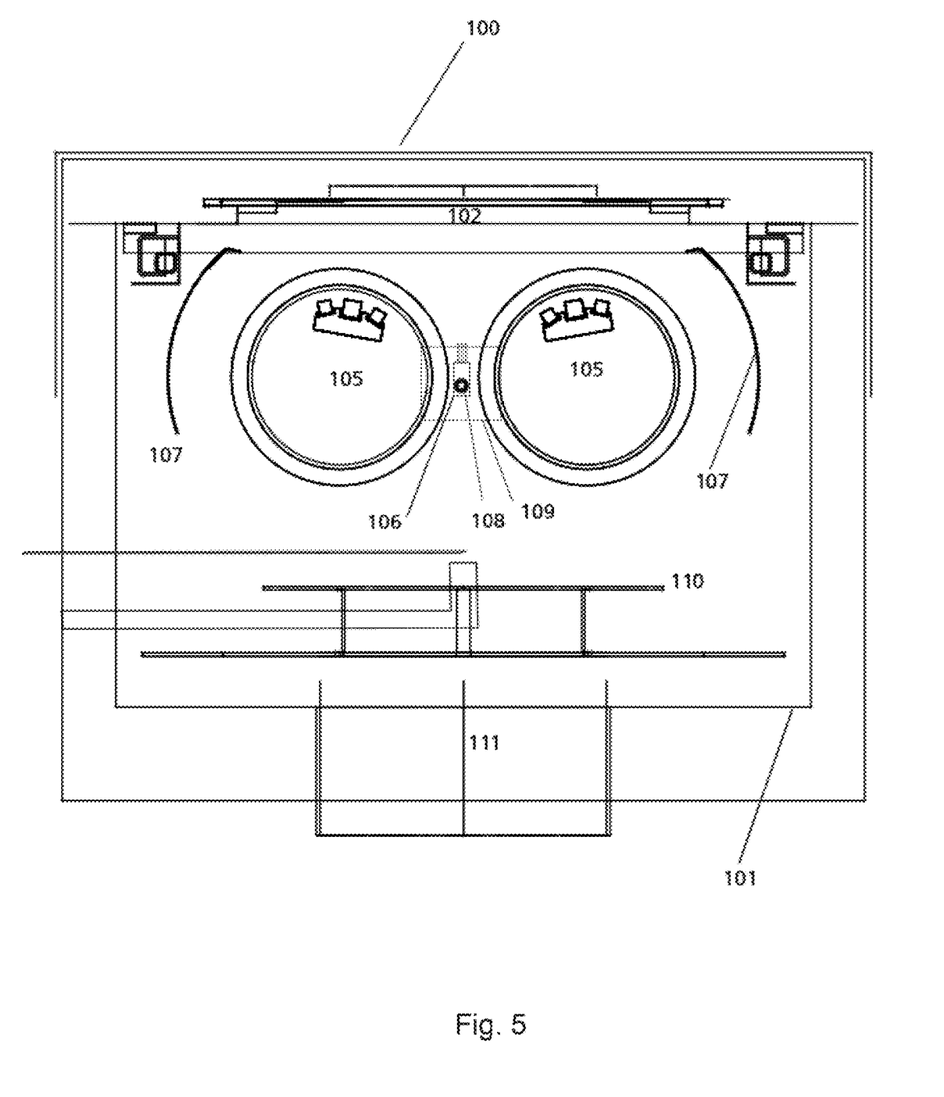
FIG. 5 shows the device in accordance with the invention from FIG. 4 in the plane transverse thereto.

FIG. 5 shows the same arrangement viewed perpendicularly thereto.

Figure 6:
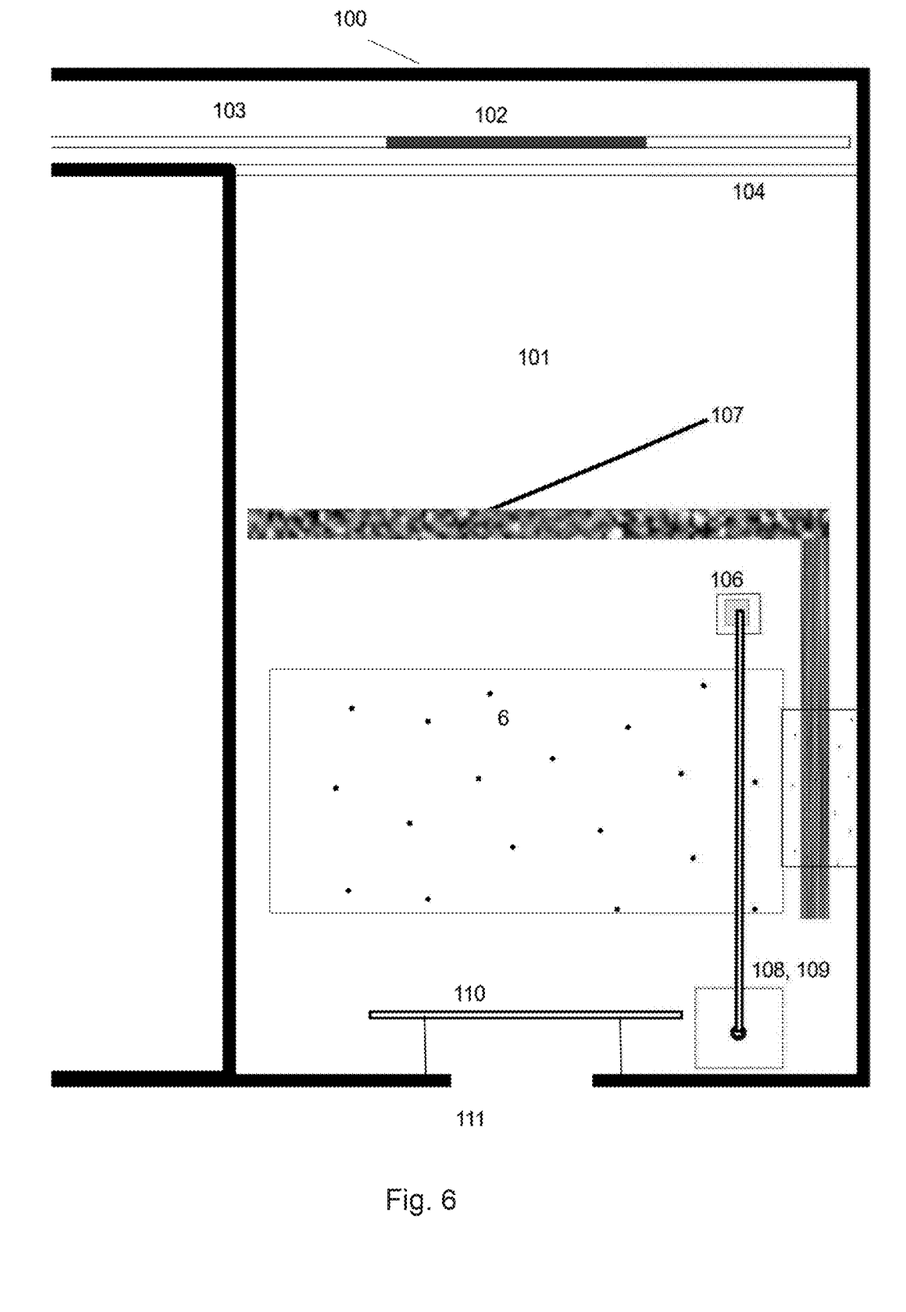
FIG. 6 shows a device in accordance with the invention in a second variant in a sectional representation.
Figure 7:
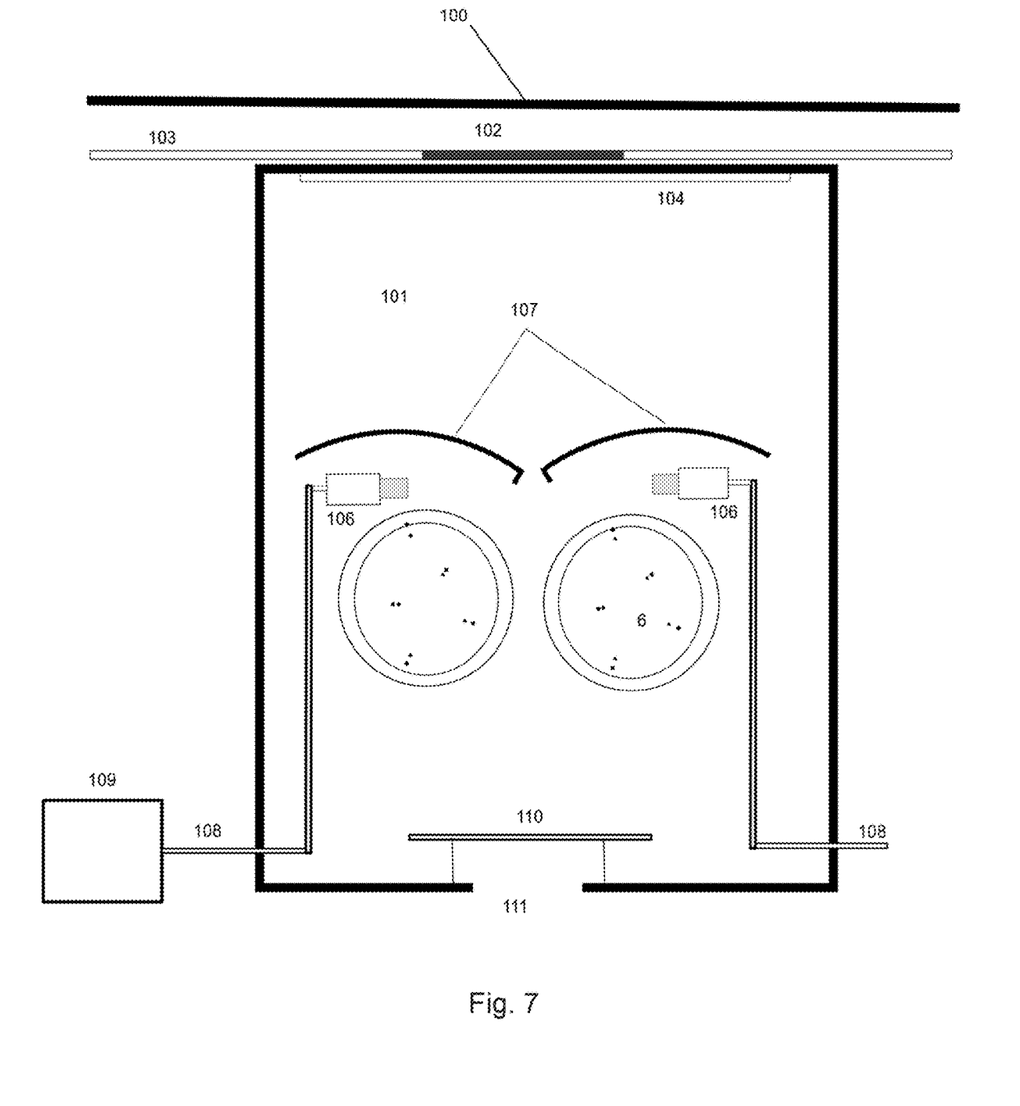
FIG. 7 shows the device in accordance with the invention from FIG. 6 in the plane transverse thereto.

FIGS. 6 and 7 show an alternative arrangement in accordance with the invention. Here, the distance between the magnetron source 105 and the substrate 102 was increased. Two microwave plasma sources 106 were arranged at the outer end of the magnetrons. Thus, by increasing the microwave plasma source power, the rate can be increased toward the outer margin so that less coating of mask 104 needs to be shielded. Even with the greater distance, the same layer properties are achieved by operating the process at a pressure of around $7 \times 10^{-4}$ mbar.

The invention claimed is:

1. A device for depositing uniform layers on rotationally moved substrates by means of magnetron sputtering comprising
 (a) a vacuum chamber with a sputtering compartment,
 (b) at least one inlet for a sputtering gas;
 (c) a turntable with at least one substrate holder; and
 (d) at least one magnetron sputtering source arranged in the sputtering compartment with at least one electrode, and
 at least one further microwave plasma source being arranged in the sputtering compartment; and
 wherein the at least one microwave plasma source for local plasma compression is arranged asymmetrically to one of the axes of the at least one electrode, and wherein the at least one microwave plasma source is placed at an end of the at least one magnetron sputtering source.

2. The device according to claim 1, wherein the at least one microwave plasma source has a magnetic field configuration for generating a spatially localized plasma.

3. The device according to claim 1, wherein the device has at least one generator for supplying power to the at least one microwave plasma source.

4. The device according to claim 1, wherein the at least one microwave plasma source comprises a protective coating.

5. The device according to claim 1, wherein an inhomogeneous removal rate increases from the turntable center to the turntable margin.

6. The device according to claim 1, wherein the device has at least one additional plasma source for pretreating the substrate surface and/or for modifying the structure and/or the stoichiometry of the layers.

7. The device according to claim 1, wherein the at least one magnetron sputtering source consists of magnetron electrodes of a cylindrical or planar source material and of a holder for this material and a target belonging thereto.

8. The device according to claim 1, wherein the distance from the substrate to the at least one electrode for each electrode amounts to, independently from one another, from 5 to 40 cm.

9. The device according to claim 1, wherein the device has a DC current supply pulsed in the mid frequency range or a pulsed DC current supply.

10. The device according to claim 1, wherein the device comprises a photometer for determining the thickness of the layer on the substrate and/or ellipsometry flanges and/or a component which exerts a polarization effect.

11. The device according to claim 1, wherein the device has an optical measuring device for determining thickness distribution of the layers.

12. The device according to claim 1, wherein the device has a regulation system for regulating and/or stabilizing the partial pressure in the magnetron sputtering device.

13. The device according to claim 1, wherein the device has at least one correction aperture.

14. A method of depositing uniform layers on rotationally moved substrates by magnetron sputtering, in which
 (a) at least one substrate is arranged on a turntable in a vacuum chamber to enable a coating on a rotational movement of the substrate and
 (b) at least one layer is deposited on the at least one substrate with at least one magnetron sputtering source arranged in the sputtering compartment and with at least one electrode, with the layers of source material of the electrodes being formed by sputter gas,
 wherein a homogeneous or inhomogeneous plasma density is generated in the sputtering compartment utilizing at least one further microwave plasma source, which causes a homogeneous or inhomogeneous removal rate of the source material on the substrate; and
 wherein the at least one microwave plasma source for local plasma compression is arranged asymmetrically to one of the axes of the at least one electrode, and wherein the at least one microwave plasma source is placed at an end of the at least one magnetron sputtering source.

15. The method according to claim 14, wherein the at least one further microwave plasma source is utilized for the magnetron sputtering source, whereby the magnetron sputtering process can be operated in the pressure range below $5 \times 10^{-3}$ mbar.

16. The method according to claim 14, wherein the inhomogeneous removal rate increases from the turntable center to the turntable margin.

17. The method according to claim 14, wherein at least one additional plasma source is utilized in the method.

18. The method according to claim 14, wherein a noble gas is utilized as the sputtering gas.

19. The method according to claim 14, wherein the plasma density of the magnetron sputtering source is increased locally by utilizing the at least one further microwave plasma source via its plasma power.

20. The method according to claim 14, wherein at least one reactive gas is utilized in addition to the sputtering gas.

21. The method according to claim 14, wherein the thickness of the layers on the substrate is monitored by at least one of the measures (a) to (f) for a process control:
 (a) time control;
 (b) optical transmission monitoring;
 (c) optical reflection monitoring;
 (d) optical absorption monitoring;
 (e) monowavelength ellipsometry or spectral ellipsometry; and
 (f) crystal quartz measurement.

* * * * *